(12) United States Patent
Gerhard

(10) Patent No.: US 12,731,955 B2
(45) Date of Patent: Sep. 8, 2026

(54) METHOD FOR PRODUCING A PLURALITY OF SEMICONDUCTOR LASERS, AND SEMICONDUCTOR LASER

(71) Applicant: ams-OSRAM International GmbH, Regensburg (DE)

(72) Inventor: Sven Gerhard, Alteglofsheim (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 609 days.

(21) Appl. No.: 18/251,890

(22) PCT Filed: Oct. 14, 2021

(86) PCT No.: PCT/EP2021/078395

§ 371 (c)(1), (2) Date: May 5, 2023

(87) PCT Pub. No.: WO2022/100951

PCT Pub. Date: May 19, 2022

(65) Prior Publication Data

US 2023/0420908 A1 Dec. 28, 2023

(30) Foreign Application Priority Data

Nov. 13, 2020 (DE) ..................... 10 2020 130 017.4

(51) Int. Cl.
*H01S 5/02* (2006.01)
*H01S 5/10* (2021.01)
*H01S 5/22* (2006.01)

(52) U.S. Cl.
CPC .......... *H01S 5/0203* (2013.01); *H01S 5/1014* (2013.01); *H01S 5/22* (2013.01)

(58) Field of Classification Search
CPC ........ H01S 5/0203; H01S 5/1014; H01S 5/22; H01S 5/028; H01S 5/10
See application file for complete search history.

(56) References Cited

U.S. PATENT DOCUMENTS 4,780,879 A 10/1988 Chinone et al.
5,032,219 A * 7/1991 Buchmann ................ H01S 5/16 385/14

(Continued)

FOREIGN PATENT DOCUMENTS

DE 102014101530 A1 8/2014
DE 102018111319 A1 11/2019

(Continued)

OTHER PUBLICATIONS

German Examination Report issued in corresponding German Patent Application No. 11 2021 004 691.8, dated Jan. 30, 2025, with English language translation, 10 pages.

(Continued)

*Primary Examiner* — Xinning(Tom) Niu
(74) *Attorney, Agent, or Firm* — MH2 Technology Law Group LLP

(57) ABSTRACT

A method for producing a plurality of semiconductor lasers is specified, including the steps of: a) providing a substrate having a semiconductor layer sequence and having a plurality of component regions, each component region having at least one resonator region and being delimited perpendicular to the resonator region by singulation lines in the transverse direction and being delimited parallel to the resonator region by singulation lines in the longitudinal direction; b) forming recesses which overlap with the singulation lines in the transverse direction, using a dry-chemical etching method; c) wet-chemical etching of the side faces of the recesses for the purpose of forming resonator surfaces; and d) singulating the substrate along the singulation lines in the transverse direction and in the longitudinal direction. Additionally, a semiconductor laser is specified.

9 Claims, 10 Drawing Sheets

(56) References Cited

U.S. PATENT DOCUMENTS

| | | | | |
|---|---|---|---|---|
| 5,179,568 | A | 1/1993 | Lang | |
| 5,355,386 | A | 10/1994 | Rothman et al. | |
| 2009/0275159 | A1* | 11/2009 | Tanisaka | B82Y 20/00 438/33 |
| 2010/0295438 | A1* | 11/2010 | Ott | F21V 13/14 313/46 |
| 2018/0152001 | A1* | 5/2018 | Fukuda | H01S 5/1014 |
| 2019/0148911 | A1* | 5/2019 | Lin | H01S 5/1082 372/43.01 |

FOREIGN PATENT DOCUMENTS

| | | | | |
|---|---|---|---|---|
| EP | 0474952 | A1 * | 3/1992 | H01L 21/02052 |
| JP | 860213072 | A | 10/1985 | |
| JP | S62-213188 | A | 9/1987 | |
| JP | S64-82688 | A | 3/1989 | |
| JP | H03-30490 | A | 2/1991 | |
| JP | H04-82289 | A | 3/1992 | |
| JP | H0864906 | A | 3/1996 | |
| JP | 2002368344 | A | 12/2002 | |
| JP | 2007266270 | A | 10/2007 | |
| JP | 2009194150 | A | 8/2009 | |
| JP | 2009295952 | A | 12/2009 | |
| JP | 2010-205748 | A | 9/2010 | |
| JP | 2012243866 | A | 12/2012 | |
| WO | 03044571 | A2 | 5/2003 | |
| WO | WO-2018204916 | A1 * | 11/2018 | H10H 20/0137 |

OTHER PUBLICATIONS

Vettiger P. et al.,; "Full-Wafer Technology—A New Approach to Large-Scale Laser Fabrication and Integration" IEEE Journal of Quantum Electronics, vol. 27, No. 6; Jun. 1991, pp. 1319-1331.

Notification of Reasons for Refusal issued in corresponding Japanese Patent Application No. 2023-528407 dated Apr. 16, 2024, with English translation, 15 pages.

Claessen, M. (Authorized officer), International Search Report dated Jul. 15, 2022, PCT Application No. PCT/EP2021/078395, 20 pages (including English translation).

German Search Report issued in corresponding DE Application No. 10 2020 130 017.4 dated Jul. 2, 2021, 5 pages.

Böttcher T. et al.; "Realization of a GaN Laser Diode with Wet Etched Facets" Wiley-VCH Verlag Berlin GmbH, Phys. Stat. Sol. (A) 2002, vol. 191, No. 1, R3-R5.

Charles P. et al.; "On-wafer facet processing for low cost optoelectronic components" Electronics Letters; Jul. 31, 1997; vol. 33, No. 16.

Yuasa T. et al.; "Performance of dry-etched short cavity GaAs/AlGaAs multiquantum-well lasers" Journal of Applied Physics; Mar. 1, 1988; vol. 63, No. 5, pp. 1321-1327.

German Search Report issued in corresponding German Patent Application No. 11 2021 004 691.8 dated Aug. 25, 2025, 8 pages (with English translation).

German Office Action issued in corresponding German Patent Application No. 11 2021 004 691.8, dated Jan. 23, 2026, 8 pages, with English language translation.

* cited by examiner

METHOD FOR PRODUCING A PLURALITY OF SEMICONDUCTOR LASERS, AND SEMICONDUCTOR LASER

CROSS-REFERENCE TO RELATED APPLICATIONS

The present application is a national stage entry from International Application No. PCT/EP2021/078395, filed on Oct. 14, 2021, published as International Publication No. WO 2022/100951 A1 on May 19, 2022, and claims priority to German Patent Application No. 10 2020 130 017.4, filed Nov. 13, 2020, the disclosures of all of which are hereby incorporated by reference in their entireties.

FIELD OF THE INVENTION

The present application relates to a method for producing semiconductor lasers and to a semiconductor laser.

BACKGROUND OF THE INVENTION

In the production of edge-emitting semiconductor lasers, for example semiconductor lasers that emit in the blue or ultraviolet spectral region, the facets that constitute the resonator surfaces of the semiconductor lasers are typically fabricated by scribing and breaking. However, this method is prone to variation and is costly.

An object to be solved is to achieve high-quality resonator surfaces reliably and cost-effectively.

This object is solved, inter alia, by a method and a semiconductor laser according to the independent patent claims. Further embodiments and expediencies are the subject of the dependent patent claims.

SUMMARY OF THE INVENTION

A method of producing a plurality of semiconductor lasers is specified.

According to at least one embodiment of the method, the method comprises a step of providing a substrate comprising a semiconductor layer sequence and comprising a plurality of device regions. A device region here corresponds, for example, to a region of the substrate with the semiconductor layer sequence from which a semiconductor laser emerges during production.

For example, the semiconductor layer sequence comprises an active region provided for generating radiation, which is located between a first semiconductor layer of a first conductivity type and a second semiconductor layer of a second conductivity type different from the first conductivity type. For example, the active region is provided for generating radiation in the ultraviolet, visible or infrared spectral range.

The substrate is, for example, a growth substrate for the semiconductor layer sequence. However, the substrate can also be a carrier different from the growth substrate, which is applied to the semiconductor layer sequence before the singulation in semiconductor lasers, i.e. still in the wafer compound.

According to at least one embodiment of the method, each device region comprises at least one resonator region. For example, each device region comprises exactly one resonator region or at least two resonator regions. A width of the resonator region, i.e. an extension of the resonator region in a lateral direction perpendicular to the resonator axis, is for example between 1 μm and 60 μm inclusive.

In particular, a resonator region is understood to be a region in which lateral guiding of the radiation propagating in the resonator between the resonator surfaces takes place. The radiation is, for example, index-guided or gain-guided.

For example, the resonator region is a ridge waveguide. Alternatively, the resonator region is, for example, a region of the semiconductor laser in which the radiation propagates in a gain-guided manner within the resonator, for example by means of a current feeding limited in the lateral direction. Lateral structuring of the semiconductor layer sequence to form an elevation is not necessary in this case.

For example, each device region is respectively bounded by singulation lines in the transverse direction and by singulation lines in the longitudinal direction. The singulation lines correspond to the places at which, in particular at the end of the method, singulation into the plurality of semiconductor lasers takes place.

Here, the longitudinal direction is considered to be a direction parallel to the main extension direction (or resonator axis) of the resonator region. In the completed semiconductor laser, the radiation generated in the active region oscillates along the resonator axis in the resonator region. The transverse direction is perpendicular to the longitudinal direction.

According to at least one embodiment of the method, the method comprises a step in which recesses are formed that overlap with the singulation lines in the transverse direction. In particular, the recesses are also located at a point where the resonator axis of the resonator region meets the singulation lines in the transverse direction.

The recesses are produced, for example, by a dry chemical etching process, such as a plasma etching process. For this structuring of the semiconductor layer sequence, a lithographic process can be applied, for example using a photoresist mask or a hard mask. The recesses are formed, for example, in such a way that they extend in places through the semiconductor layer sequence. For example, the recesses also extend into the substrate.

For example, the recesses have a depth in the vertical direction, i.e. perpendicular to a main extension plane of the semiconductor layer sequence, of between 2 μm and 25 μm inclusive.

According to at least one embodiment of the method, the method comprises a step in which the side surfaces of the recesses for forming resonator surfaces are wet-chemically etched. By means of the wet chemical etching, material can be removed not only in the vertical direction but also in the lateral direction. Starting from the structuring in the form of recesses previously achieved by dry chemical etching, wet chemical etching can be used to expose crystal planes that run perpendicular to the longitudinal direction. During wet chemical etching, the mask used for the dry chemical etching process may already have been removed or may still be present on the semiconductor layer sequence.

According to at least one embodiment of the method, the method comprises a step in which the substrate is singulated along the singulation lines in the transverse direction and in the longitudinal directions. The singulation of the substrate is performed in particular after the dry chemical etching process and the wet chemical etching process. Thus, the resonator surfaces of the semiconductor laser are not formed during the singulation of the substrate, but have already been formed in a preceding step. Chemical processes such as wet chemical or dry chemical etching, for example plasma etching, mechanical processes such as sawing or breaking and/or processes using laser radiation such as laser ablation or stealth dicing are suitable for the singulation.

In at least one embodiment of the method of producing a plurality of semiconductor lasers, a substrate comprising a semiconductor layer sequence and comprising a plurality of device regions is provided, each device region having at least one resonator region and being bounded perpendicular to the resonator region by singulation lines in the transverse direction and parallel to the resonator region by singulation lines in longitudinal direction. Recesses are formed that overlap with the singulation lines in the transverse direction, in particular by a dry chemical etching process. The side surfaces of the recesses are wet chemically etched to form resonator surfaces. The substrate is singulated along the singulation lines in the transverse direction and in the longitudinal direction.

With the method described, resonator surfaces can be formed by a two-stage etching process, with the substrate being singulated only after the resonator surfaces have been formed. The singulation itself therefore no longer has any direct influence on the quality of the resonator surfaces. In particular, high-quality resonator surfaces can be produced with a high degree of efficiency and, compared to production by scribing and breaking, at low cost and with comparatively low variations.

According to at least one embodiment of the method, a crystal plane running perpendicular to the resonator region is exposed at least in the region of the resonator regions during wet chemical etching. This can be achieved, for example, by a wet chemical etching process which is characterized by a high selectivity with respect to the crystal directions.

According to at least one embodiment of the method, the semiconductor layer sequence is based on a nitride compound semiconductor material.

For example, wet chemical etching exposes a (1-100) plane of the semiconductor layer sequence. The (1-100) plane is also referred to as m-plane.

For nitride compound semiconductor material, for example, a basic solution through which $OH^-$ ions are formed is suitable. For example, KOH, TMAH or $NH_3$ can be used.

Based on "nitride compound semiconductor material" means in the present context that the semiconductor layer sequence or at least a part thereof, particularly preferably at least the active region and/or the growth substrate, comprises or consists of a nitride compound semiconductor material, preferably $Al_x In_y Ga_{1-x-y} N$, where $0 \leq x \leq 1$, $0 \leq y \leq 1$ and $x+y \leq 1$. This material does not necessarily have to have a mathematically exact composition according to the above formula. Rather, it may have, for example, one or more dopants as well as additional constituents. For the sake of simplicity, however, the above formula contains only the essential constituents of the crystal lattice (Al, Ga, In, N), even if these may be partially replaced and/or supplemented by small amounts of other substances.

An active region based on nitride compound semiconductor material can generate radiation in the ultraviolet, blue or green spectral range with high efficiency.

However, the described method is also suitable for other semiconductor materials, in particular other III-V compound semiconductor materials such as $Al_x In_y Ga_{1-x-y} P$, especially for yellow to red radiation, or $Al_x In_y Ga_{1-x-y} As$, especially for red and infrared radiation. Here, in each case $0 \leq x \leq 1$, $0 \leq y \leq 1$ and $x+y \leq 1$, in particular with $x \neq 1$, $y \neq 1$, $x \neq 0$ and/or $y \neq 0$ apply.

According to at least one embodiment of the method, the recesses are formed by the dry chemical etching process in such a way that they are spaced from the singulation lines in the longitudinal direction, for example by at least 1 μm. In this case, therefore, the recesses do not extend continuously across adjacent device regions.

According to at least one embodiment of the method, the recesses have a polygonal basic shape. For example, a basic shape with four or more than four corners, such as five corners, six corners or eight corners, may be used.

In particular, the recesses may be formed and arranged relative to the resonator regions such that the corners are located to the side of the respective resonator region in a top view of the semiconductor laser.

According to at least one embodiment of the method, at least two side surfaces of the polygonal base shape enclose an angle between 100° and 140° inclusive, in particular between 110° and 130° inclusive, for example 120°.

Thus, for wet chemical etching, side surfaces are offered which are at an angle greater than 90° to each other. For example, it has been found for semiconductors based on nitride compound semiconductor material that particularly smooth surfaces, which can serve as resonator surfaces, can be formed in the vicinity of such corners, for example corners with an angle between adjacent side surfaces of 120°. The quality of the crystal planes to be produced can thus be positively influenced by the specific shaping of the recesses.

According to at least one embodiment of the method, the recesses have a basic shape that is curved at least in places. For example, at least a partial area of a border of the recess has a circular or elliptical basic shape. For example, a radius of curvature of the recesses in the region of the resonator regions is between 10 times and 500 times a width of the resonator region, inclusive. Here, the width of the resonator region denotes the extension of the resonator region in the transverse direction. A curved basic shape of the recesses provides different angles relative to the crystal planes for the wet chemical etching process. The specified ratio of the radius of curvature relative to the width of the resonator region can further ensure that a planar resonator surface is formed in the region of the resonator regions by the wet chemical etching process. After the wet chemical etching process, the side surface of the recess is flat in the optically effective area, i.e. in the area of the resonator region.

The recesses can also be curved in places and straight in places when viewed from above the semiconductor laser. For example, the polygonal basic shapes may have one or more rounded corners.

According to at least one embodiment of the method, recesses adjacent in the transverse direction are connected to each other by a channel. In contrast to the recesses, the channels are arranged in particular outside the area of the resonator region. Via such a channel, an exchange of media between the individual recesses can be achieved during wet chemical etching. Furthermore, the wetting of the semiconductor material with the etching solution can also be improved. The depth of the channels may be the same as or different from the depth of the recesses. For example, a shallower depth may be sufficient for the channels than for the recesses.

According to at least one embodiment of the method, the recesses between adjacent device regions extend continuously along the singulation lines in the longitudinal direction. In other words, the recesses extend continuously along the singulation lines in the transverse direction across a plurality of device regions or even across all device regions of the substrate along that direction. For example, the recesses are trench-shaped, with a main direction of extension of the trenches along the singulation lines in the transverse direction.

According to at least one embodiment of the method, the resonator regions are ridge waveguides. The semiconductor layer sequence is structured in particular in the lateral direction in such a way that the ridge waveguide forms an elevation in which index guiding of the radiation propagating in the oscillator can take place.

According to at least one embodiment of the method, the ridge waveguides have a widened region along the singulation lines in the transverse direction. In the widened region, the extension in the transverse direction is greater than the extension of the ridge waveguide in the transverse direction in the remaining region. The widened region may extend in the transverse direction to the singulation lines in the longitudinal direction or may be spaced from these singulation lines. Along the longitudinal direction, the extension of the widened region is preferably small compared to the extension of the semiconductor laser along that direction. For example, the extension of the widened region along the longitudinal direction within a device region is at most 20% or at most 10% or at most 2% of the extension of the device region or the semiconductor laser to be fabricated along that direction.

In particular, the recesses can be formed in the widened region. For example, the recesses can be formed along the transverse direction starting from a semiconductor material that is at the same height. This reduces the risk that the change in height at the edge of the ridge waveguide will affect the quality of the resonator surfaces to be produced.

According to at least one embodiment of the method, the recesses are formed entirely within the widened region. Thus, immediately after their formation, the recesses are surrounded along their entire circumference by semiconductor material which is at the same level.

After singulation in semiconductor lasers along the singulation lines in the transverse direction, the recess may extend to the side surface in transverse direction formed during singulation. At all locations spaced from the side surface in transvers direction, seen in plan view, the recess may be adjacent to semiconductor material that is at the same level.

Alternatively, the recesses can also extend continuously along the singulation lines in the transverse direction over several or all device regions, for example in the form of a trench. A continuous recess can thus be adjacent to several widened regions.

Furthermore, a semiconductor laser is specified. The method described above is suitable, for example, for producing the semiconductor laser. Features described in connection with the method can therefore also apply for the semiconductor laser and vice versa.

According to at least one embodiment, the semiconductor laser comprises a semiconductor layer sequence and a resonator region, the semiconductor laser extending along the resonator region between two side surfaces extending in transverse direction, the semiconductor laser having resonator surfaces on each of the side surfaces in transverse direction that are offset from the side surfaces.

In a top view of the semiconductor laser, the resonator surfaces are therefore not located on the side surfaces running in the transverse direction. The distance between opposite resonator surfaces is here smaller than the length of the semiconductor chip along the longitudinal direction.

According to at least one embodiment of the semiconductor laser, the semiconductor laser has a recess along each of the side surfaces in transverse direction, wherein the recess extends in a curved or bent manner laterally of the resonator region as viewed in a plan view of the semiconductor laser. Here, a partial area of the side surface of the recess forms the resonator surface. The curved or kinked portion of the side surface of the recess is disposed laterally of the resonator surface. In the vertical direction, the recess extends, for example, into a substrate of the semiconductor laser on which the semiconductor layer sequence of the semiconductor laser is arranged, for example deposited.

According to at least one embodiment of the semiconductor laser, the resonator region is formed as a ridge waveguide.

According to at least one embodiment of the semiconductor laser, the ridge waveguide has a widened region in the transverse direction. Thus, the resonator region is formed by a ridge waveguide having a widened region. For example, the widened region extends at least in places to the nearest side surface in the transverse direction. Alternatively, the widened region may be spaced from the lateral surface in the transverse direction at any location.

According to at least one embodiment of the semiconductor laser the widened region extends to the nearest side surface in the longitudinal direction, in particular on both opposite side surfaces. Alternatively, the widened region may be spaced from the side surface in the longitudinal direction at any point.

For example, the recess is disposed in the widened region, the recess extending to a transverse side surface in plan view of the semiconductor laser. At all locations spaced from this side surface in transverse direction in plan view, the recess may be adjacent to the widened region. Thus, the adjacent semiconductor material has the same height at these locations.

BRIEF DESCRIPTION OF THE DRAWING

Further embodiments and expediencies will be apparent from the following description of the exemplary embodiments in conjunction with the Figures.

In the Figures.

DETAILED DESCRIPTION

Figure 1A:
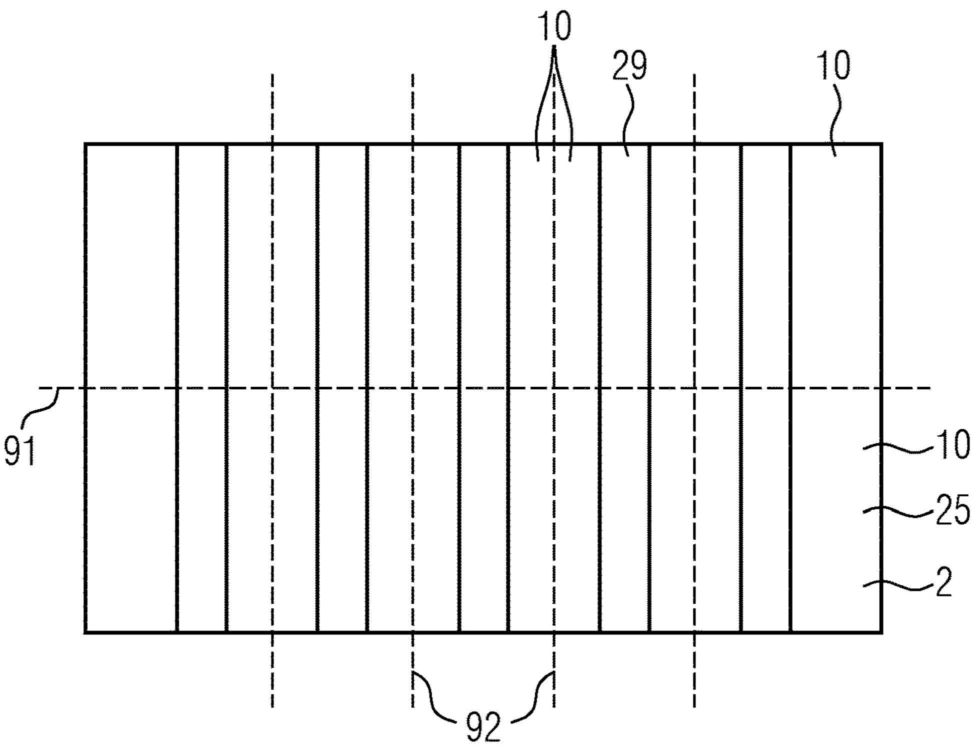
FIGS. 1A, 1B, 1C, 1D and 1E show an exemplary embodiment for a method of producing semiconductor lasers by means of intermediate steps shown schematically in plan view in each case.

Elements that are identical, similar or have the same effect are each given the same reference signs.

The Figures are each schematic representations and therefore not necessarily true to scale. Rather, individual elements and in particular also layer thicknesses may be shown in exaggerated size for better understanding and/or for better representability.

With reference to FIGS. 1A to 1D, an exemplary embodiment for a method of producing a plurality of semiconductor lasers is shown in each case by means of a schematic representation in plan view. Here, a section of a substrate 25 having ten device regions 10 is shown. The device regions are each bounded by two singulation lines in the transverse direction 91 and singulation lines in the longitudinal direction 92 extending perpendicularly thereto.

A semiconductor layer sequence 2 is formed on the substrate 25, wherein the device regions 10 each have a resonator region 29. The substrate is, for example, a growth substrate for epitaxial deposition semiconductor layer sequence, such as GaN for epitaxial deposition of a semiconductor layer sequence based on nitride compound semiconductor material. Deviating from the described exemplary embodiment, a semiconductor laser 1 to be produced may also have more than one resonator region 29. The semiconductor lasers to be produced may be index-guided or gain-guided, for example.

Figure 1B:
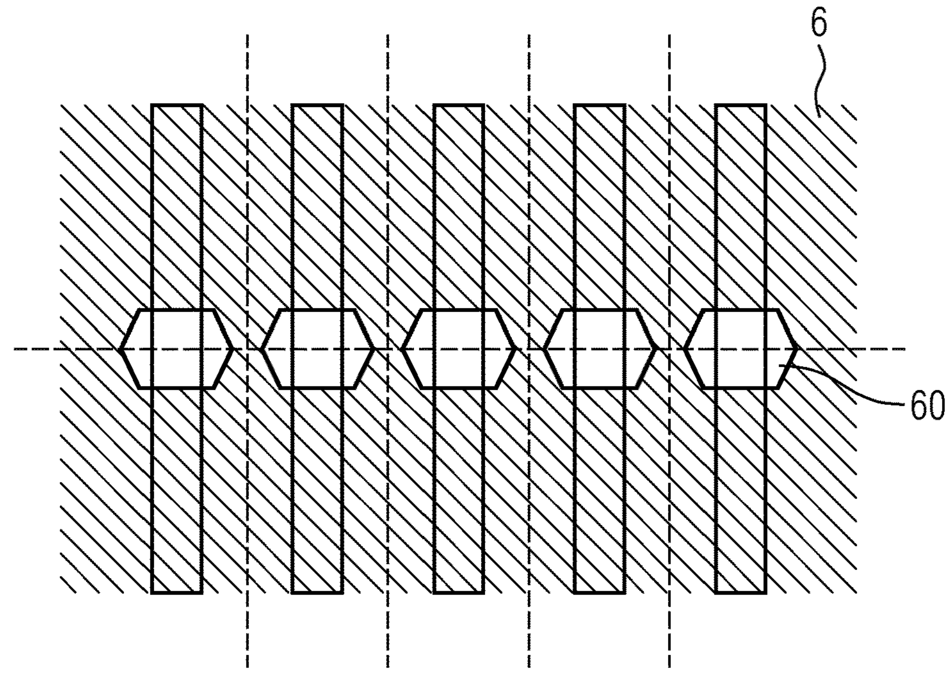

As illustrated in FIG. 1B, a mask 6 shown hatched in FIG. 1B is formed on the substrate 25 with a plurality of openings 60. The mask may be a photoresist mask or a hard mask, for example an SiN mask or an $SiO_2$ mask.

Figure 1C:
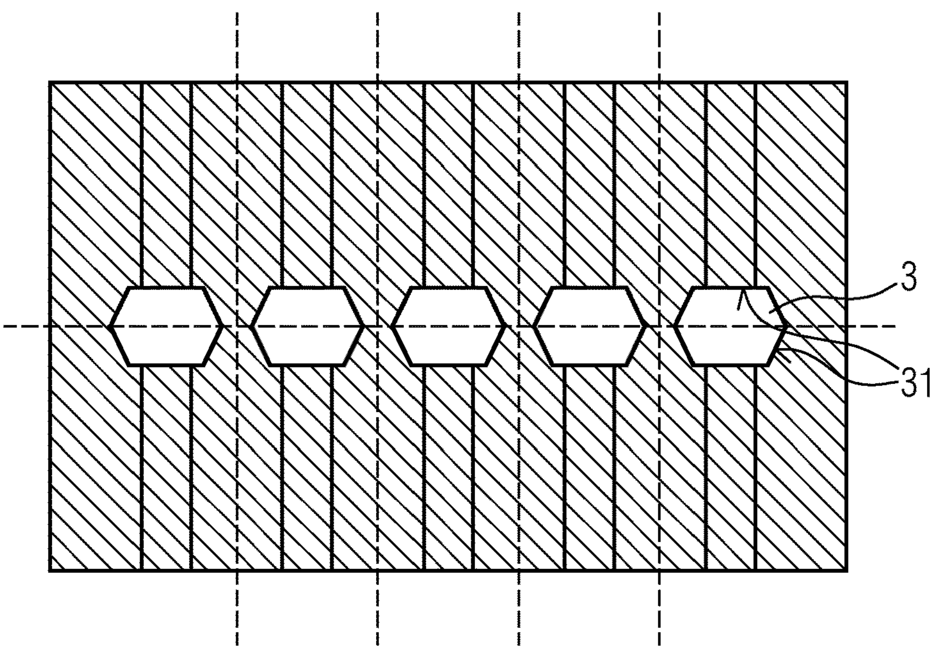

In the region of the openings 60, the substrate with the semiconductor layer sequence is subjected to a dry chemical etching process, for example a plasma etching process, so that the recesses 3 are formed in the region of the openings 60. The recesses overlap with the singulation lines in the transverse direction 91. The recesses 3 extend, for example, through the semiconductor layer sequence 2 into the substrate 25 (FIG. 1C).

Figure 1D:
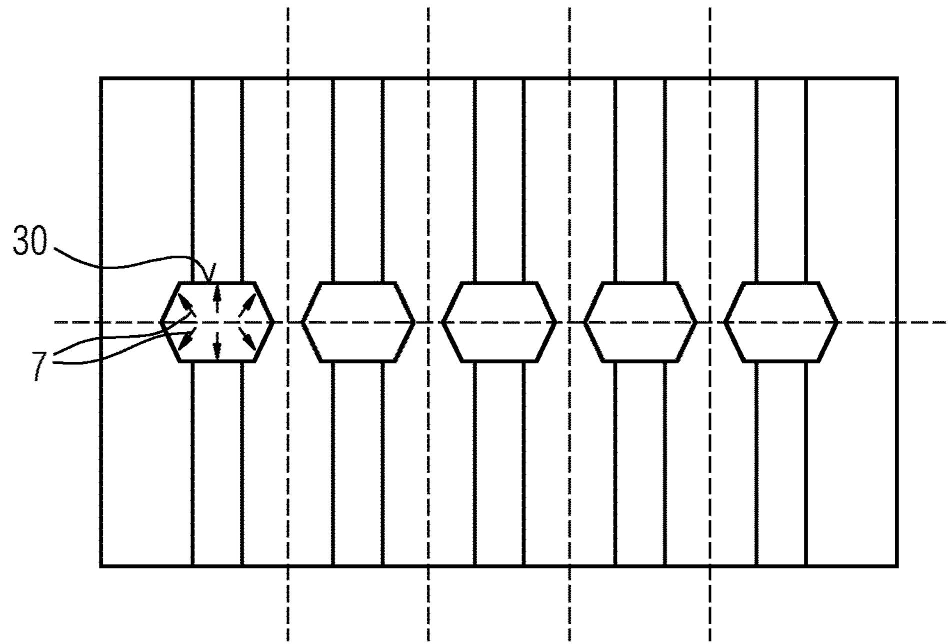

In a subsequent step, the side surfaces 31 of the recesses 3 are wet-chemically etched, as schematically shown in FIG. 1D with arrows 7 for a recess 3, whereby resonator surfaces 30 are formed in the region of the resonator regions 29. The wet chemical etching is performed in such a way that it has a high selectivity with respect to the crystal directions of the semiconductor material, so that a crystal plane running perpendicular to the longitudinal direction of the semiconductor lasers to be produced is exposed. For example, for a semiconductor laser with a semiconductor layer sequence based on nitride compound semiconductor material it may be a (1-100) crystal plane.

At the time of wet chemical etching, the mask 6 may already have been removed, as shown in FIG. 1D. However, it may also be appropriate to remove the mask only after the wet chemical etching.

Figure 1E:
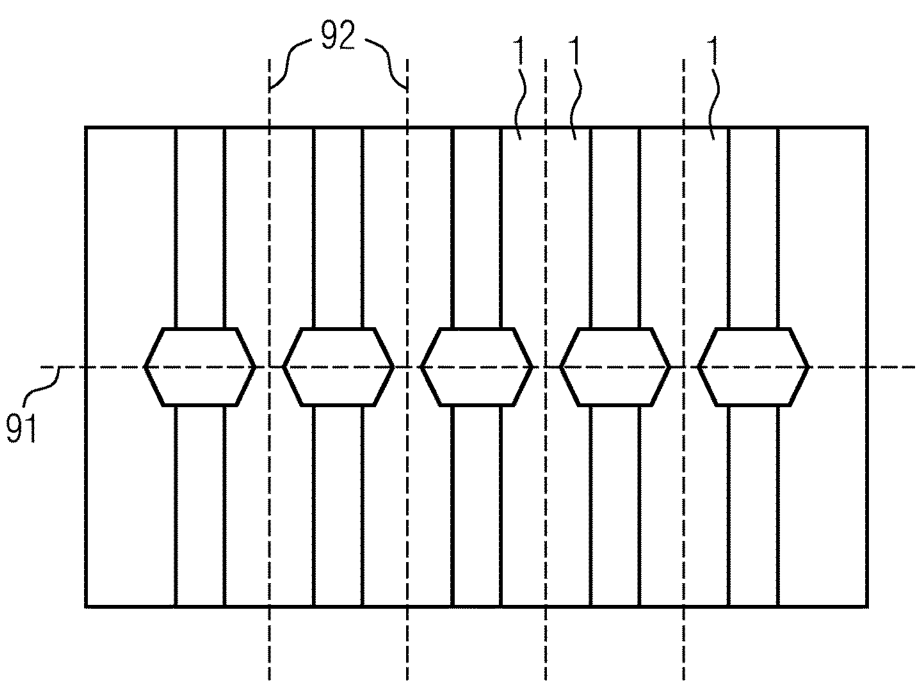

Subsequently, the substrate is singulated along the singulation lines in transverse direction 91 and the singulation lines in longitudinal direction 92 (FIG. 1E). Along the singulation lines in transverse direction 91 transverse side surfaces 11 are formed and along the singulation lines in longitudinal direction 92 longitudinal side surfaces 12 of the respective semiconductor laser are formed (cf. FIG. 9A). At the time of singulation the resonator surfaces 30 have already been formed, so that the singulation process itself has no direct influence on the quality of the resonator surfaces. Thus, there is a high flexibility with respect to the singulation process. For example, the singulation can be performed mechanically, chemically or by means of laser radiation.

In the exemplary embodiment shown, the recesses 3 have a polygonal, in particular hexagonal, basic shape when viewed from above the substrate 25. An angle between two side surfaces 31 of the recess 3 is, for example, between 100° and 140° inclusive, approximately 120°. For nitride compound semiconductor material it has turned out that the resonator surfaces 30 can be produced with a particularly high quality if for the wet chemical etching process not only side surfaces are offered which run parallel or perpendicular to the crystal plane to be exposed. In particular, a particularly high quality for the resonator surfaces 30 can be achieved with an angle of 120° or at least approximately 120° for nitride compound semiconductor material.

Figure 2A:
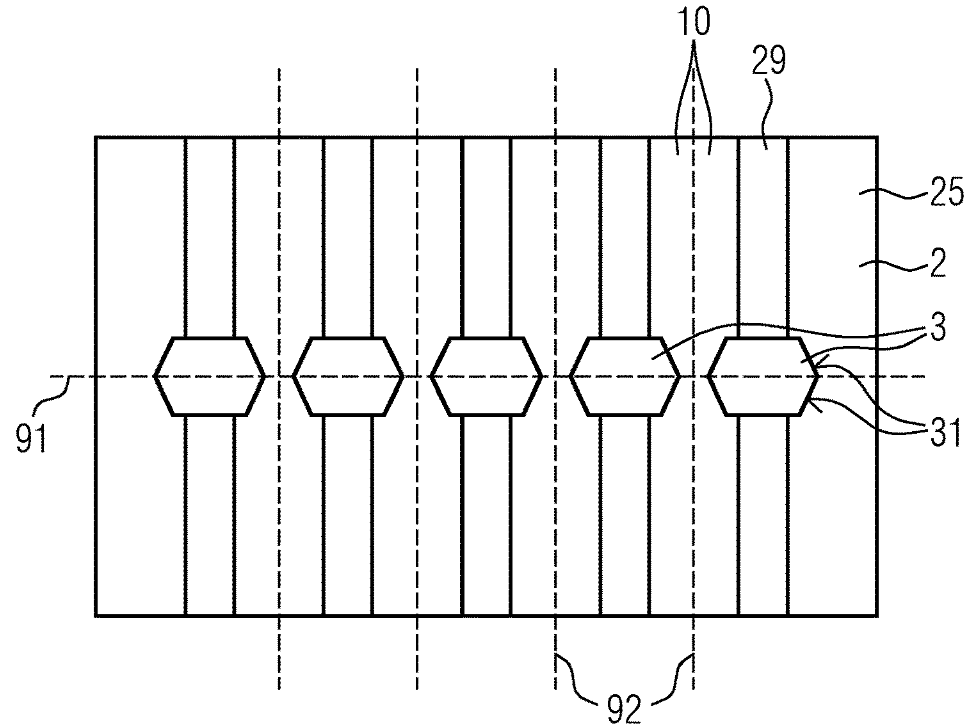
FIGS. 2A, 2B and 2C in each case show an exemplary embodiment for a method in each case by means of a schematic representation of an intermediate step in plan view.
Figure 2B:
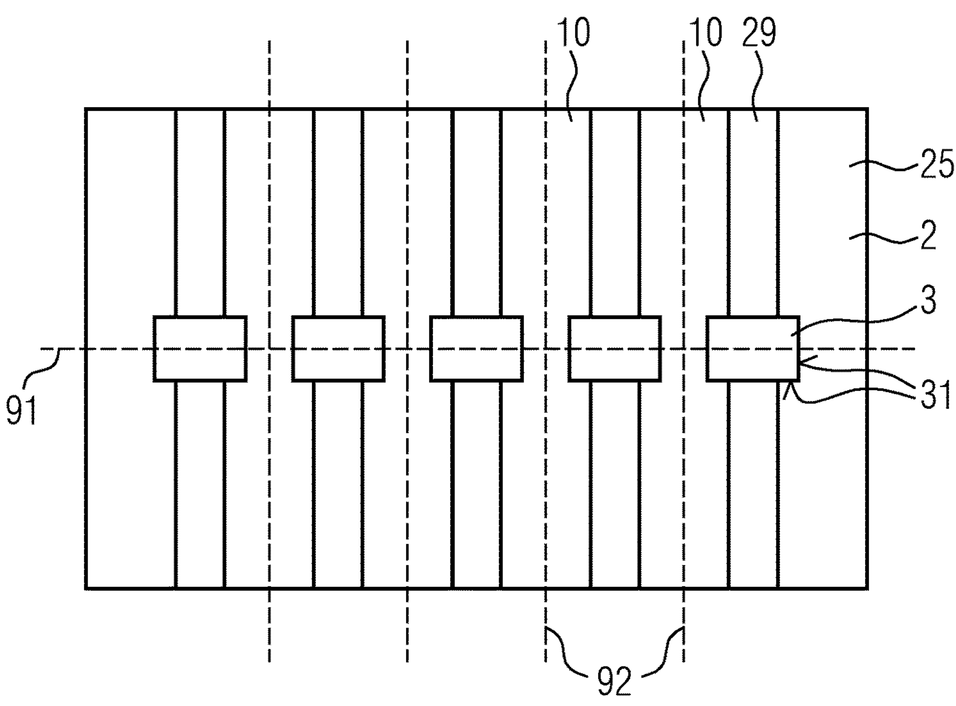
Figure 2C:
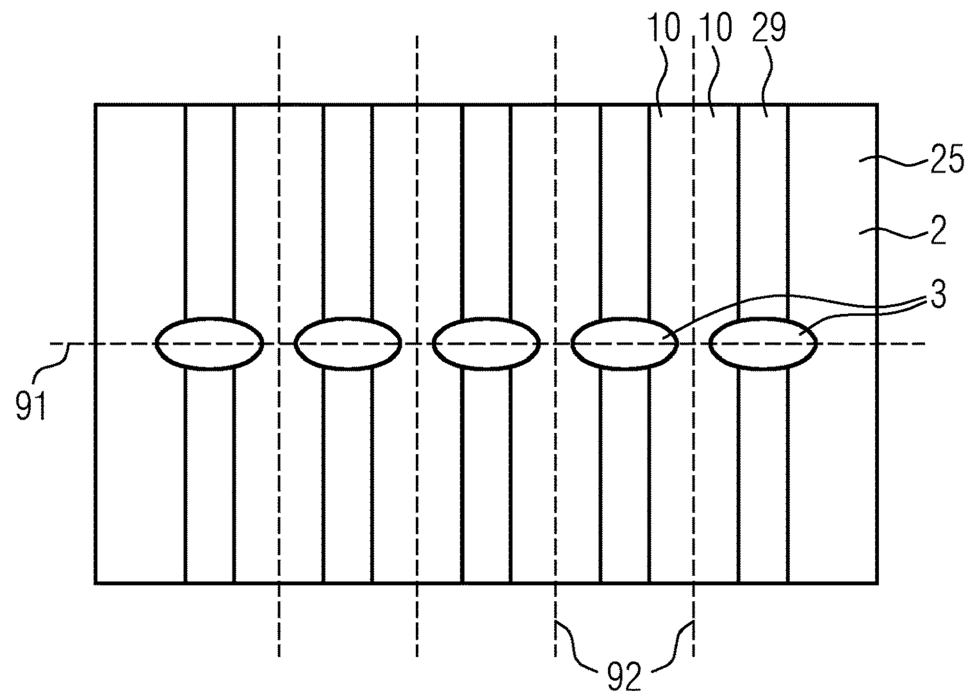

In principle, however, different shapes can be used for the recesses 3. This is illustrated by FIGS. 2A to 2C. As an alternative to a polygonal, in particular hexagonal, basic shape (FIG. 2A), a square, for example rectangular, basic shape is shown in FIG. 2B.

In the exemplary embodiment of FIG. 2C, the recesses 3 have a basic shape that is curved in places, exemplarily an elliptical basic shape. In the case of a curved basic shape, a radius of curvature of the recesses 3 in the region of the resonator regions 29 is between 10 times and 500 times a width of the resonator region 29. In this way, it can be achieved that the semiconductor material is removed in the region of the resonator region 29 during the wet chemical etching process in such a way that a flat resonator surface 30 is produced.

Partially curved basic shapes and polygonal basic shapes can also be combined, for example in the form of polygons with rounded corners.

Multi-angular recesses 3 are preferably formed and arranged relative to the resonator region 29 in such a way that the corners of the basic multi-angular shape are spaced apart from the resonator region 29 when viewed in the transverse direction. Each resonator region 29 is thus adjacent to only one side surface of the recesses.

Figure 3A:
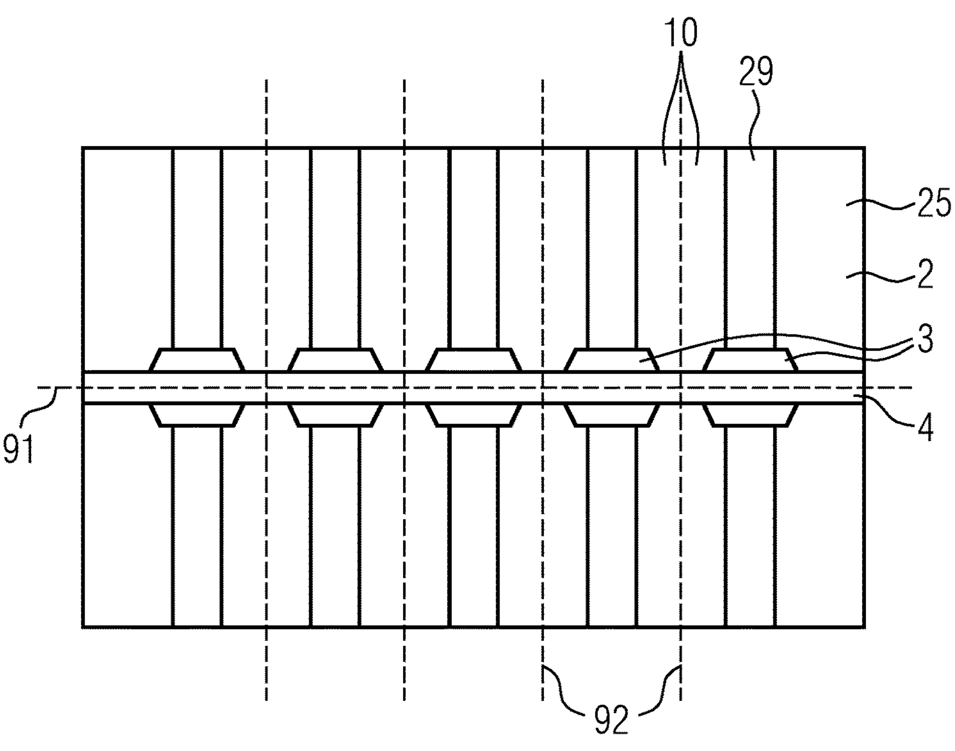
FIGS. 3A to 3C in each case show an exemplary embodiment for a method in each case by means of a schematic representation of an intermediate step in plan view.
Figure 3B:
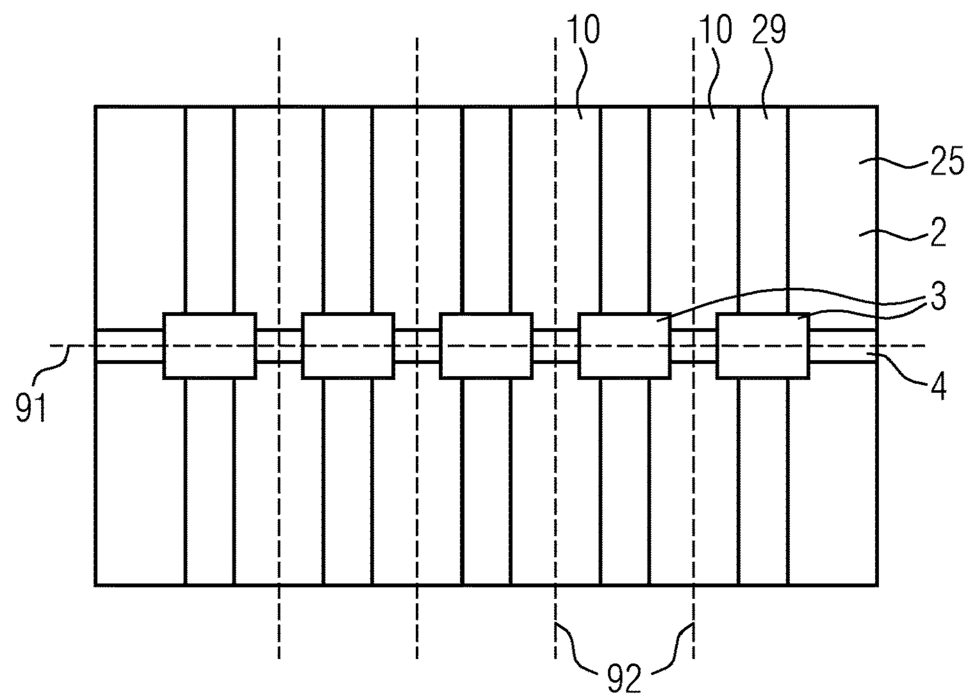
Figure 3C:
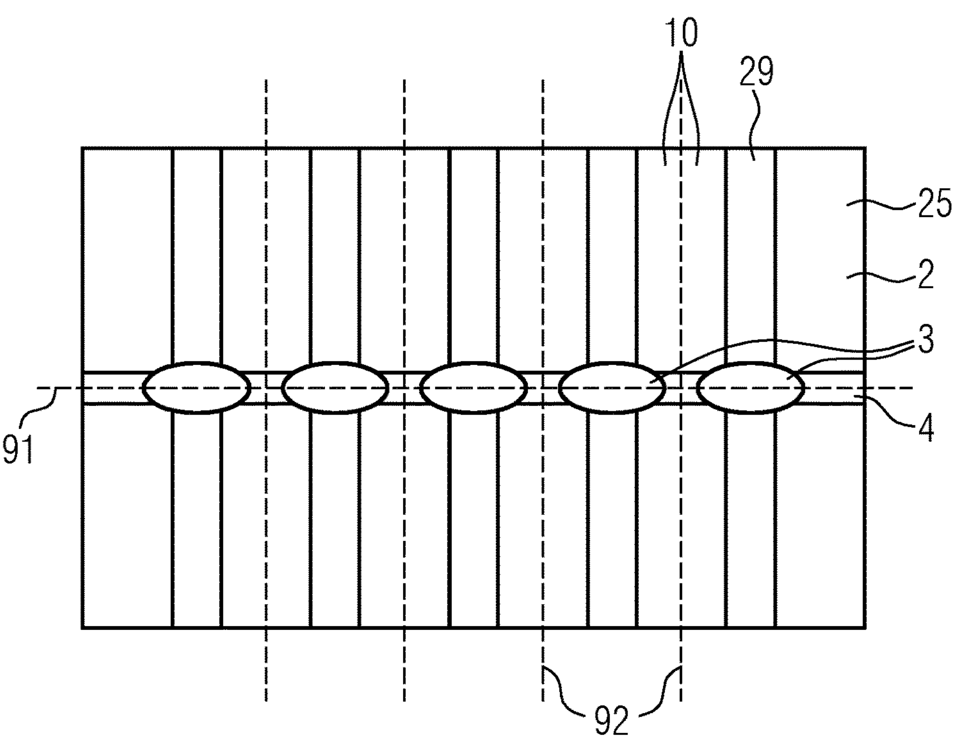

The exemplary embodiments illustrated in FIGS. 3A through 3C substantially correspond to those described in connection with FIGS. 2A through 2C.

In contrast, the recesses 3 are connected to each other in the transverse direction by a channel 4. The channel 4 can extend in each case along the transverse direction over two or more, in particular also over all, device regions 10. The depth of the channels 4 may correspond to the depth of the recesses 3 or may be smaller or larger. Media exchange can take place via the channels 4 during the wet chemical etching process. This facilitates a uniform formation of the individual resonator surfaces 30 in the lateral direction across the substrate for the semiconductor lasers 1 to be produced.

Figure 4A:
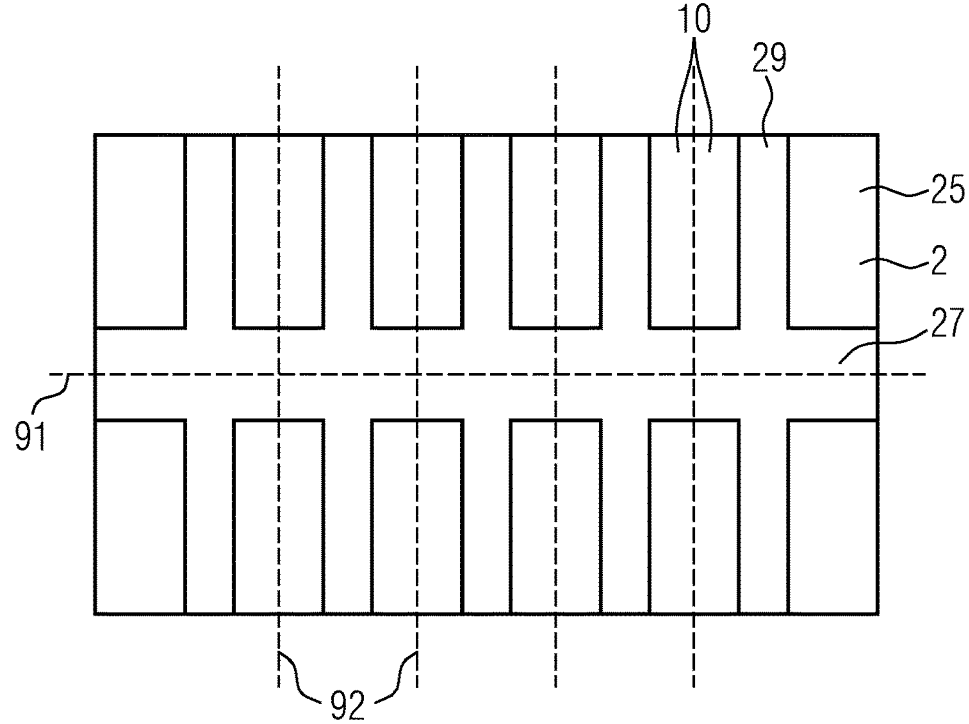
FIGS. 4A and 4B show an exemplary embodiment of a method by means of two schematically illustrated intermediate steps in plan view.
Figure 4B:
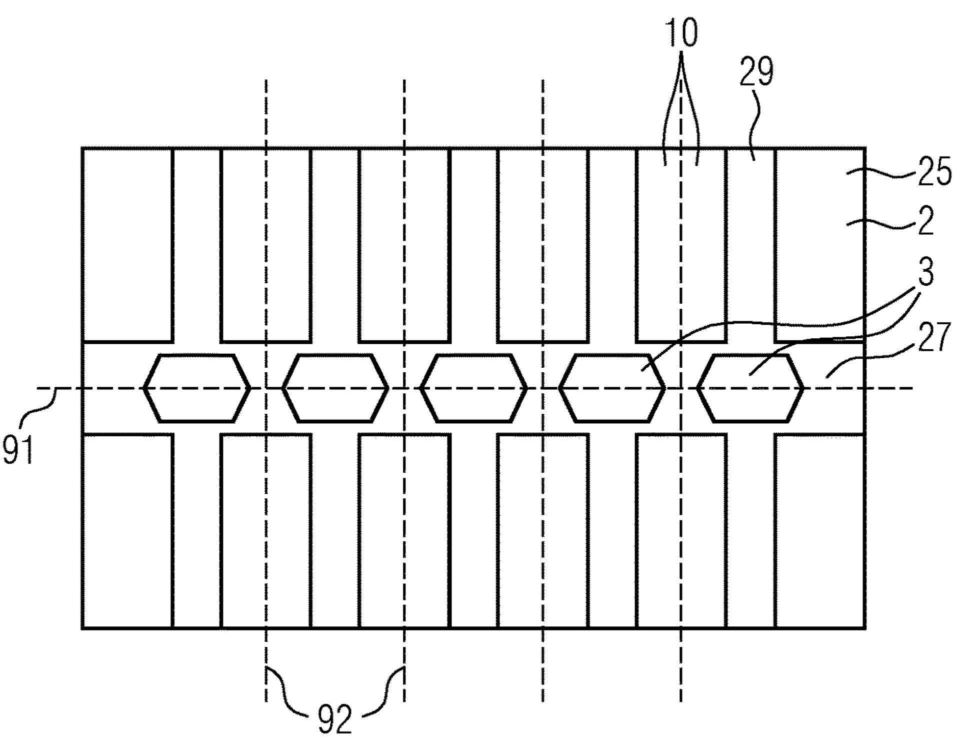

In the exemplary embodiment shown in FIGS. 4A and 4B, the resonator region 29 is a ridge waveguide. The ridge waveguide has a widened region 27. In the widened region 27, the ridge waveguide has a greater width than in the remaining region. The widened region 27 extends in a transverse direction and, in the illustrated embodiment, extends continuously across adjacent resonator regions 29. In a top view of the substrate, the widened region 27 overlaps with the singulation lines in the transverse direction 91. In the vertical direction, the widened region 27 has the same thickness as the resonator region 29 configured as a ridge waveguide.

As shown in FIG. 4B, the recesses 3 can each be formed to be entirely within the widened region 27. Thus, the recesses 3 are surrounded along their entire circumference by semiconductor material which is at the same level prior to the dry chemical etching process. This can reduce the risk that the elevation formed by the resonator region 29, which is designed as a ridge waveguide, will cause perturbation of the resonator surface 30 to be formed.

In the exemplary embodiment shown in FIG. 4B, the recesses 3 are polygonal, in particular hexagonal. However, other basic shapes can also be used for the recesses 3, for example the configurations described in connection with FIGS. 2A to 2C.

Figure 5:
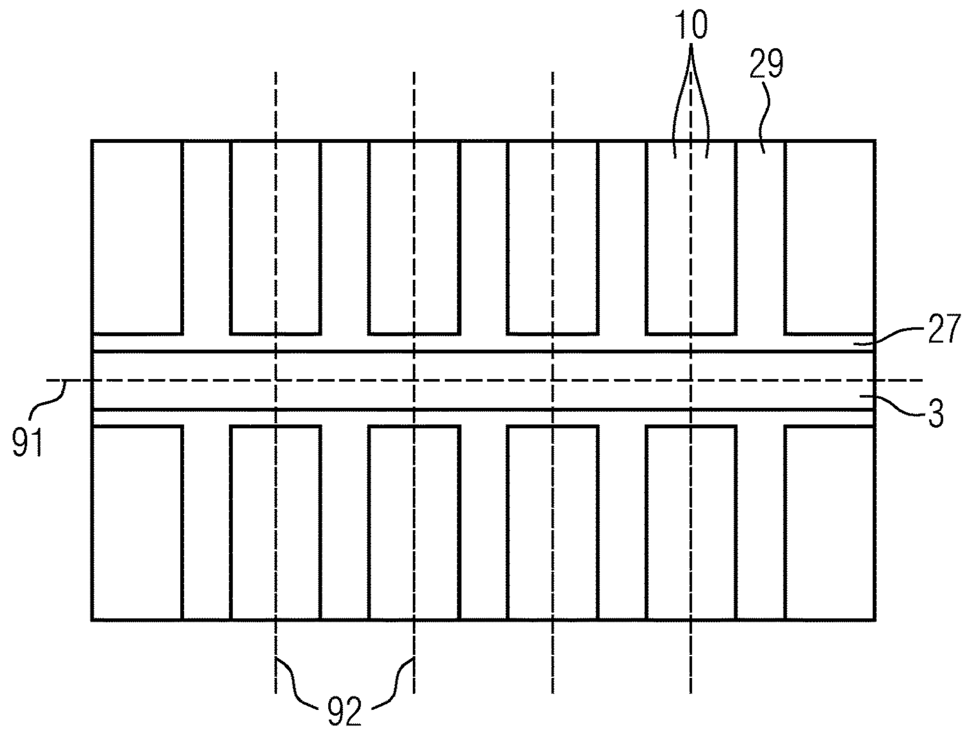
FIG. 5 shows an exemplary embodiment of a method by means of a schematically illustrated intermediate step in plan view.

The exemplary embodiment shown in FIG. 5 corresponds essentially to the exemplary embodiment described in connection with FIGS. 4A and 4B. In contrast, a recess 3 extends in a trench-like manner continuously over several device regions 10. Thus, a recess 3 is associated with a plurality of resonator regions 29 of different device regions 10.

Figure 6A:
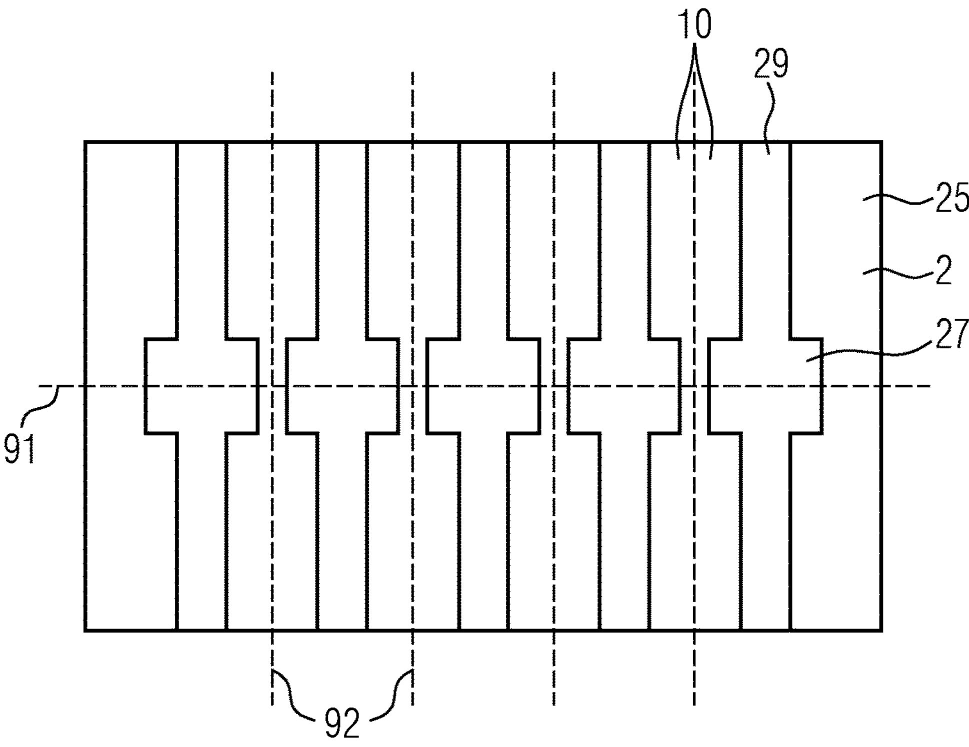
FIGS. 6A and 6B show an exemplary embodiment for a method by means of two schematically illustrated intermediate steps in plan view.
Figure 6B:
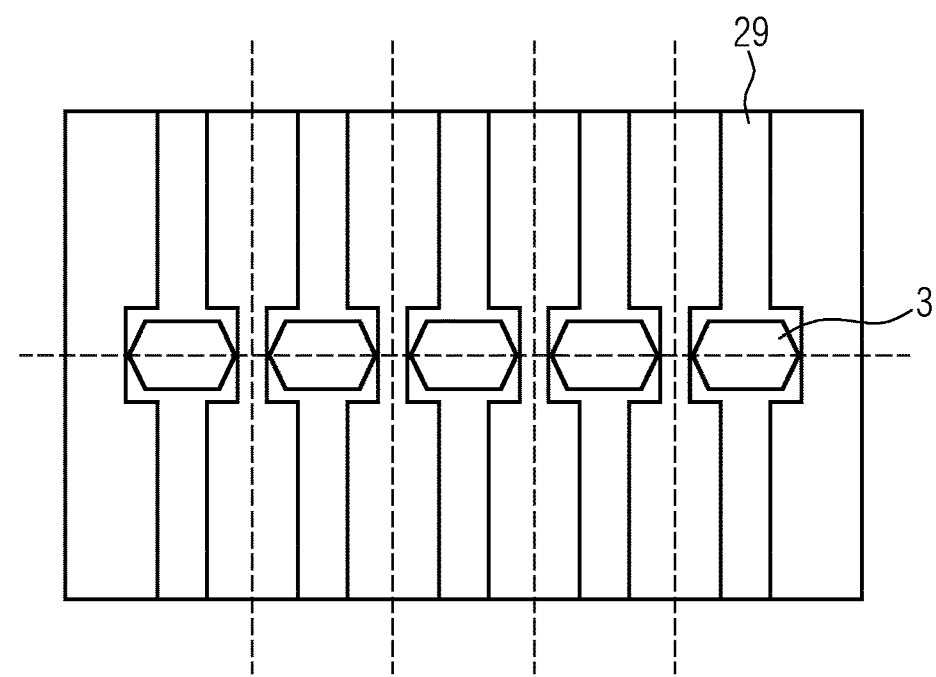

The exemplary embodiment illustrated in FIGS. 6A and 6B substantially corresponds to the exemplary embodiment illustrated in connection with FIGS. 4A and 4B. In contrast, the widened region 27 does not extend continuously across adjacent device regions 10. Each device region 10 has an associated widened region 27 spaced from the associated singulation lines in longitudinal direction 92. In addition to hexagonal basic shapes, the other basic shapes of recesses 3 described above can also be used in this exemplary embodiment.

Figure 7:
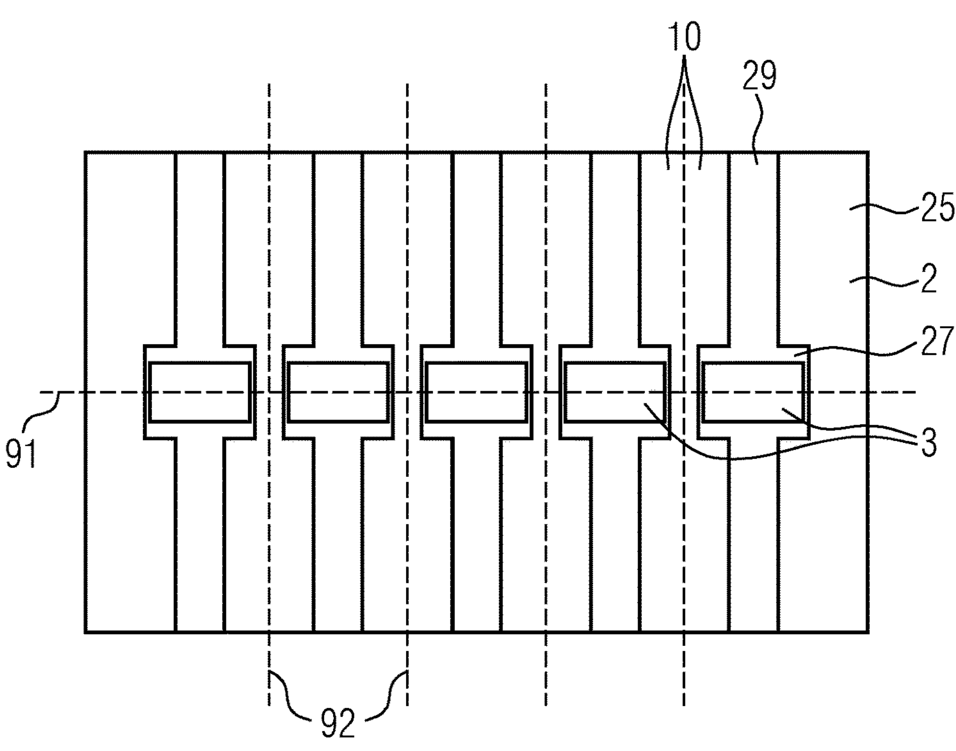
FIG. 7 shows an exemplary embodiment of a method by means of a schematically illustrated intermediate step in plan view.

For example, as shown in FIG. 7, a rectangular basic shape can be used for the recesses 3.

Figure 8:
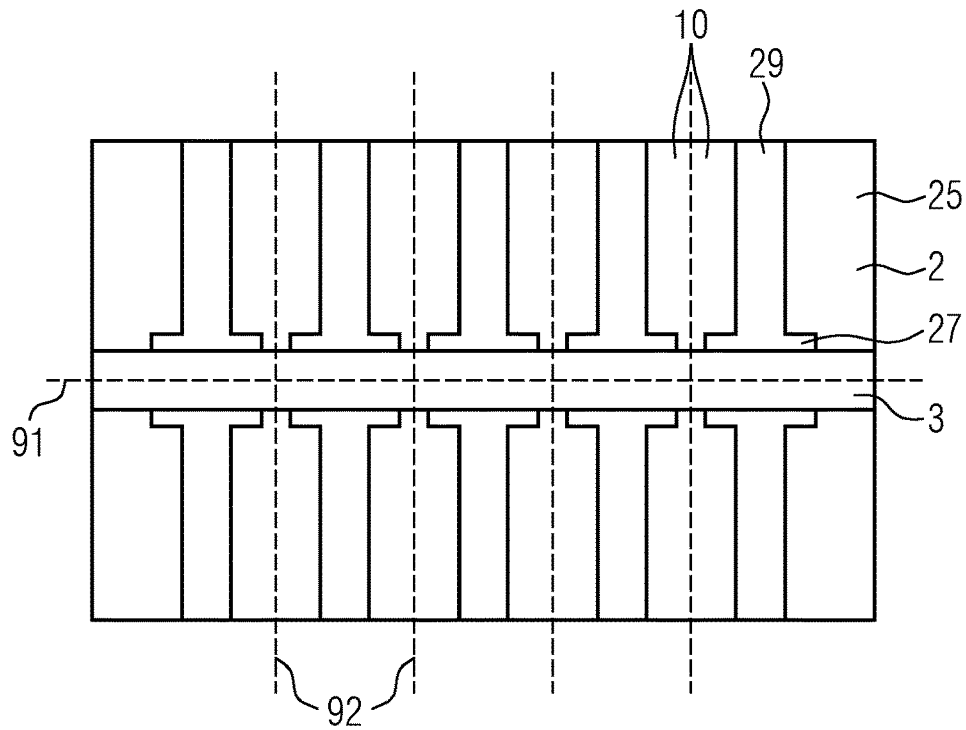
FIG. 8 shows an exemplary embodiment of a method by means of a schematically illustrated intermediate step in plan view.

The exemplary embodiment shown in FIG. 8 is substantially the same as the exemplary embodiment described in connection with FIGS. 6A and 6B.

In contrast, a recess 3 as described in connection with FIG. 5 extends continuously over transversely adjacent device regions 10.

Figure 9A:
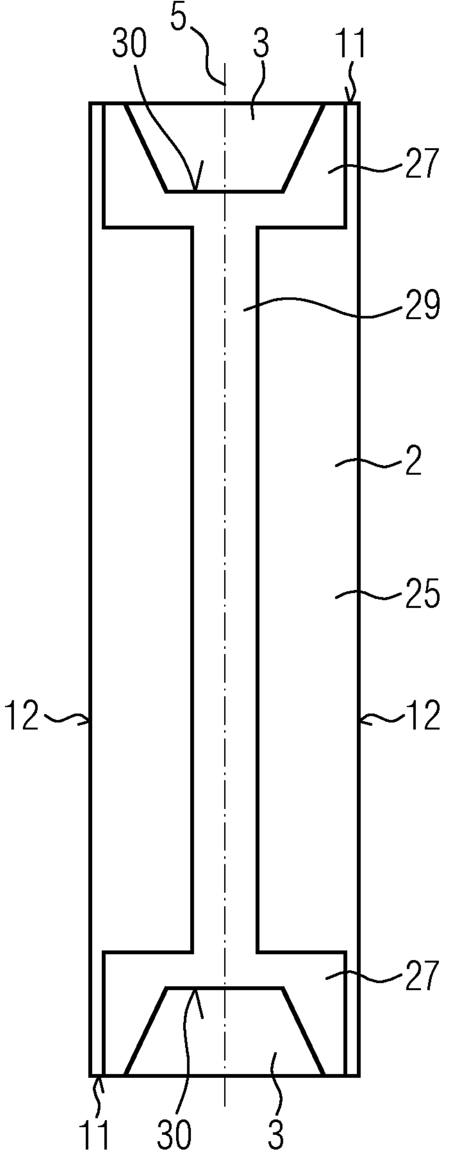
FIGS. 9A and 9B show an exemplary embodiment for a semiconductor laser in schematic top view (FIG. 9A) and corresponding side view (FIG. 9B).
Figure 9B:
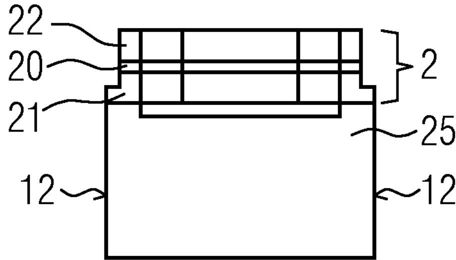

FIGS. 9A and 9B illustrate an exemplary embodiment of a semiconductor laser in schematic top view and corresponding side view. Exemplarily, a semiconductor laser is shown which can be produced as described in connection with FIG. 6B. However, the configurations described in connection with the various exemplary embodiments for the method, in particular for the widened region 27 and/or the embodiment of the recesses 3 are applicable analogously for the semiconductor laser 1.

The semiconductor laser 1 comprises a substrate 25 and a semiconductor layer sequence 2 arranged on the substrate 25. The semiconductor layer sequence has an active region 20 arranged between a first semiconductor layer of a first conductivity type 21 and a second semiconductor layer of a second conductivity type 22, such that the active region is located in a pn junction. For example, the first semiconductor layer is n-type and the second semiconductor layer 22 is p-type. Contact areas for external electrical contacting the first semiconductor layer 21 and the second semiconductor layer 22 are not explicitly shown in FIG. 9B for simplicity.

The semiconductor laser 1 comprises a resonator region 29, wherein the semiconductor laser 1 extends in the longitudinal direction, i.e. along a resonator axis 5, between two side surfaces 11 in transverse direction. Perpendicular to this, the semiconductor laser 1 has side surfaces 12 in longitudinal direction. In the exemplary embodiment shown, the resonator region 29 is formed as a ridge waveguide. Deviating from this, however, the resonator region 29 can also be a region of the semiconductor laser 1 in which the radiation oscillates in the resonator in a gain-guided manner.

On each of the side surfaces 11 in transverse direction, the semiconductor laser has a resonator surface 30 which is arranged offset from the side surfaces 11 in transverse direction of the semiconductor laser 1. The resonator surfaces 30 bound the resonator region 29 on two opposite sides as viewed along the resonator axis 5.

Furthermore, the semiconductor laser 1 comprises a recess 3, wherein a side surface 31 of the recess forms the resonator surface 30. The recess 3 extends into the substrate 25 in the vertical direction, i.e. perpendicular to the main extension plane of the semiconductor layer sequence 2. In the exemplary embodiment shown, the recess 3 is formed in the region of a widened region 27 of the resonator region 29 formed as a ridge waveguide. In a top view of the semiconductor laser, the recess extends to the side surface 11 in transverse direction. At all locations spaced from this side surface 11 in transverse direction in a top view of the semiconductor laser, the recess 3 may be directly adjacent to the widened region 27. Thus, the semiconductor material directly adjacent to the recess 3 has the same height at these locations.

However, such a widened region 27 is not mandatory as described in connection with the method. Further, the widened region 27 may also extend to the side surfaces 12 in longitudinal direction such that the widened region 27 has the same transverse extension as the semiconductor laser 1. Similarly, the recess 3 may also extend to the side surfaces 12 in longitudinal direction.

The invention is not limited by the description based on the exemplary embodiments. Rather, the invention encompasses any new feature as well as any combination of features, which in particular includes any combination of features in the patent claims, even if this feature or combination itself is not explicitly stated in the patent claims or the exemplary embodiments.

The invention claimed is:

1. A method of producing a plurality of semiconductor lasers comprising:

a) providing a substrate comprising a semiconductor layer sequence and comprising a plurality of device regions, each device region having at least one resonator region and being bounded perpendicular to the resonator region by singulation lines in a transverse direction and parallel to the resonator region by singulation lines in a longitudinal direction;

b) forming recesses overlapping with the singulation lines in the transverse direction by a dry chemical etching process, wherein the recesses have a basic shape which is curved at least in places, wherein a radius of curvature of the recesses in the region of the resonator regions is between 10 times and 500 times a width of the resonator region;

c) wet chemical etching of the side surfaces of the recesses to form resonator surfaces; and d) singulating the substrate along the singulation lines in the transverse direction and in the longitudinal direction.

2. The method according to claim 1, wherein at least in the region of the resonator regions in step c) a crystal plane extending perpendicular to the resonator region is exposed.

3. The method according to claim 1, wherein the semiconductor layer sequence is based on a nitride compound semiconductor material, and in step c) a (1-100) plane of the semiconductor layer sequence is exposed.

4. The method according to claim 1, wherein the recesses in step b) are formed such that they are spaced apart from the singulation lines in the longitudinal direction.

5. The method according to claim 4, wherein the recesses have a polygonal basic shape.

6. The method according to claim 5, wherein at least two side surfaces of the polygonal base shape include an angle between 100° and 140° inclusive.

7. The method according to claim 4, wherein recesses adjacent in the transverse direction are connected to one another by a channel.

8. The method according to claim 4, wherein the recesses between adjacent device regions extend continuously across the singulation lines in the longitudinal direction.

9. The method according to claim 1, wherein the resonator regions are ridge waveguides, the ridge waveguides having a widened region along the singulation lines in the transverse direction, and the recesses being formed in the widened region.

* * * * *